United States Patent [19]
Herbst et al.

[11] 4,334,151
[45] Jun. 8, 1982

[54] CIRCUIT PROVIDED WITH AN EXPOSURE MEASURING PART FOR SENSOR-CONTROLLED TELEMETRY

[75] Inventors: Heiner Herbst, Munich; Hans-Joerg Pfleiderer, Zorneding; Hans-Peter Grassl, Munich, all of Fed. Rep. of Germany

[73] Assignee: Siemens Aktiengesellschaft, Berlin & Munich, Fed. Rep. of Germany

[21] Appl. No.: 168,649

[22] Filed: Jul. 11, 1980

[30] Foreign Application Priority Data

Sep. 10, 1979 [DE] Fed. Rep. of Germany ....... 2936536

[51] Int. Cl.³ ............................................... G01C 3/08
[52] U.S. Cl. ................................ 250/201; 250/211 J; 307/221 D; 354/25; 356/4; 357/24
[58] Field of Search ................... 250/201, 204, 211 J, 250/578; 307/221 D; 357/24 R; 356/1, 4; 354/25

[56] References Cited

U.S. PATENT DOCUMENTS

| 4,178,098 | 12/1979 | Asano et al. ...................... 250/201 X |
| 4,283,137 | 8/1981 | Tsunekawa et al. ............ 250/204 X |
| 4,290,693 | 9/1981 | Stein ...................................... 356/1 |

FOREIGN PATENT DOCUMENTS

2813915 10/1979 Fed. Rep. of Germany .
2838647 4/1980 Fed. Rep. of Germany .

OTHER PUBLICATIONS

"Electronics", pp. 40-44, Nov. 10, 1977.

Primary Examiner—David C. Nelms
Assistant Examiner—Edward P. Westin
Attorney, Agent, or Firm—Hill, Van Santen, Steadman, Chiara & Simpson

[57] ABSTRACT

A circuit for sensor-controlled distance measurement with two linear image sensors is disclosed. These sensors are exposed to lines corresponding to two images derived from one object. The sensor signals are subjected to correlation measurements, from which the range of the object is determined. An exposure-measuring circuit determines the optimum integration time of the sensor elements. A comparing sensor element of the exposure-measuring circuit is provided in a strip-shape and co-integrated on the semiconductor member. It is positioned for exposure to an optically generated charge quantity which corresponds to a plurality of sensor elements in at least one of the image sensors. The comparison sensor element is designed as a strip-shaped photodiode arranged next to the sensor element row in at least one of the image sensors. Above a zone of the semiconductor member between the sensor element row and the comparison sensor element a gate separated by a thin insulating layer is provided and which is subjected to a constant voltage.

12 Claims, 8 Drawing Figures

CIRCUIT PROVIDED WITH AN EXPOSURE MEASURING PART FOR SENSOR-CONTROLLED TELEMETRY

BACKGROUND OF THE INVENTION

The invention relates to a circuit provided with an exposure measuring portion for sensor-controlled range finding where two linear semi-conductor image sensors are provided, each having individual sensor elements. Line segments corresponding to the two images and separately obtained from the object are projected onto the image sensors. Switching circuits are connected to the sensor elements which are switchable between two different states and an evaluator is provided for evaluating these two state sensor signals in dependence upon different position displacements with respect to a maximum correlation. A comparing sensor element is also provided and receives optically generated charge quantities corresponding to sensor elements in the image sensors.

Circuits of this type are described in German patent application P No. 28 38 647.2, incorporated herein by reference. If the linear image sensor, arranged next to the comparison-sensor element, is exposed as a projected line section which has a very great brightness over a small portion of its length, whereas the other, predominant portion of its length is dark, difficulties then occur during the determination of an integration time necessary for a precise telemetry. By the term integration time, the time span is understood in which an optical charge generation takes place in the individual sensor elements as a consequence of the exposure. In the case of a strongly non-uniform brightness distribution of this type, a portion of the optically generated charge can overflow from the sensor elements, aligned (or orientated) to the bright portions of the line section, into the adjacent elements, before the integration time determined by the comparison-sensor element has been terminated. However, this leads to signal falsifications in the sensor elements which impede a precise telemetry.

If one were to provide, next to the linear image sensor and next to the comparison-sensor element, an anti-blooming channel, known per se, consisting of a re-doped semiconductor strip, and if one were to arrange laterally adjacent to the latter, an anti-blooming gate, insulated in relation to the semiconductor member, and subjected to a fixed voltage, then this anti-blooming gate will control the overflow of the excess charge quantities into the channel. Then, in the case of the previously noted strongly non-uniform exposure of the comparison-sensor element, there would result therein a mean charge value uniformly distributed over the entire surface of the same. This value would lie only slightly above the dark value resulting for a dark line section. The analyzer connected with the comparison-sensor element would bring about a termination of the integration time only when the charge mean value reaches the magnitude of the reference charge. However, up to this time-point, also the sensor elements, aligned with respect to the dark locations of the line section, would have taken up optically generated charges which would lie only slightly below their reference charges. The digital switching states resulting in the associated analyzers are very strongly dependent upon parameter fluctuations of the sensor elements and analyzer circuits, so that a brightness progression, actually not present along the slightly exposed portion of the sensor line, is simulated.

SUMMARY OF THE INVENTION

An object of the invention is to eliminate the above cited difficulties in a circuit of the type initially cited. This object is achieved by providing a circuit of the previously described type wherein the comparing sensor element is designed as a strip-shaped photodiode arranged next to the sensor element row in at least one of the image sensors. Above a zone of the semiconductor member between the sensor element row and the comparison sensor element, a gate separated by a thin insulating layer from the semiconductor member is provided, said gate being subjected to a constant voltage.

The advantage which can be achieved with the invention lies, in particular, in the fact that an overflow current, brought about by a strongly non-uniform exposure of the linear image sensor, influences the analyzer which is connected with the comparison sensor element. This terminates the integration time so promptly that no overflow of charge from the too strongly irradiated sensor elements into the adjacent elements results, on the one hand, and that the optically generated charges, collected in the slightly exposed sensor elements, clearly lie below the reference charges.

DESCRIPTION OF THE PREFERRED EMBODIMENTS

Figure 1:
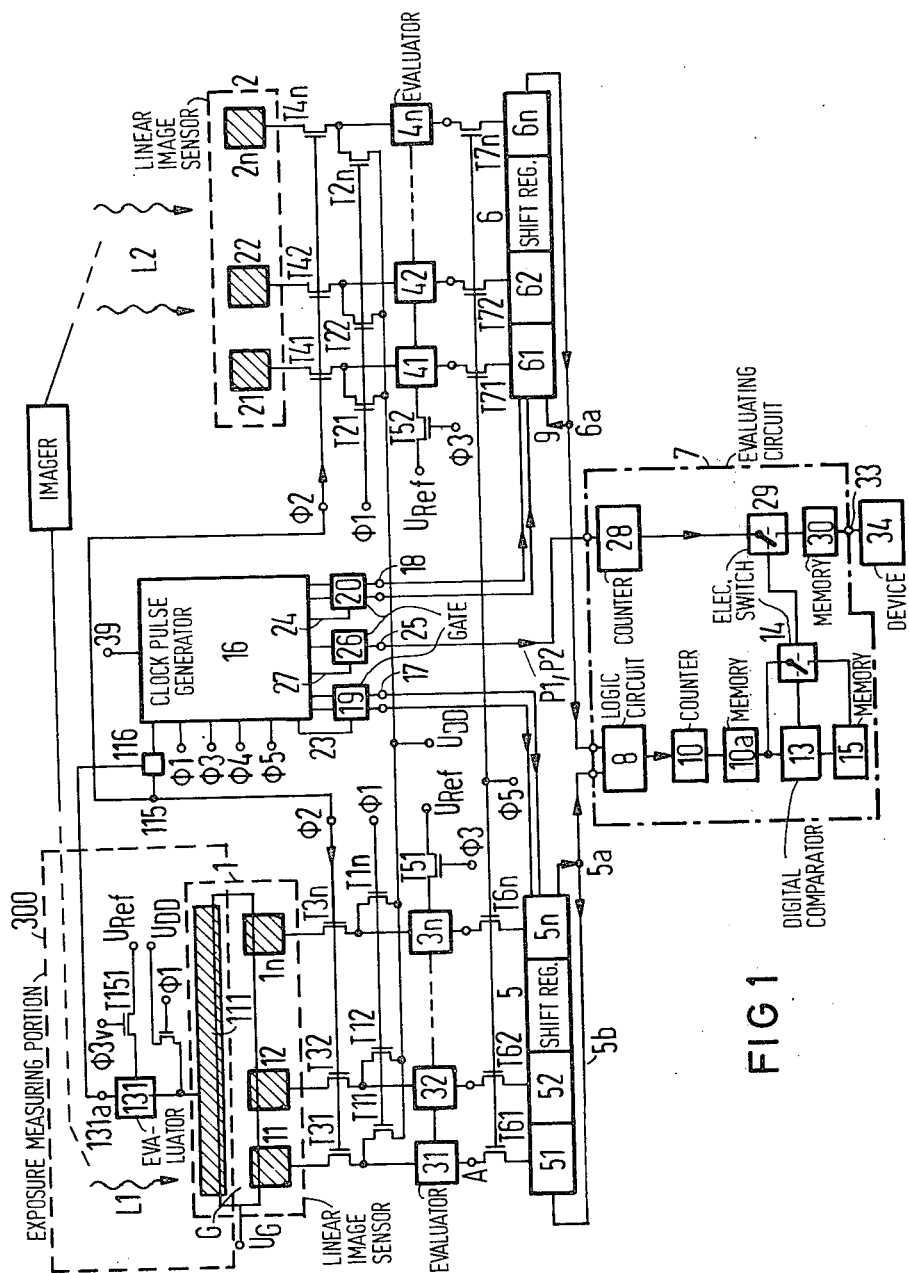
FIG. 1 illustrates a first embodiment of the invention.

The circuit illustrated in FIG. 1 contains two linear image sensors 1 and 2 which are equipped with sensor elements 11, 12 . . . 1n and 21, 22 . . . 2n. The image sensors are integrated on a doped semiconductor of a first conductivity type. If the sensor elements are realized in the form of photodiodes, then the hatched rectangles represent regions of a second conductivity type, opposite to the first, which are arranged on a boundary surface of the semiconductor member. The sensor elemnts 11 . . . 1n and 21 . . . 2n are connected with terminals via series-connected, individually allocated switching transistors T11 . . . T1n and T21 . . . T3n or T21 . . . T2n and T41 . . . T4n, respectively, which are wired with a supply voltage $U_{DD}$. The gate electrodes of the switching transistors T11 . . . T1n and T21 . . . T2n are respectively guided to a common terminal to which a clock pulse voltage $\phi 1$ is supplied. The sensor elements 11 . . . 1n and 21 . . . 2n, on the other hand, are connected with the inputs of analyzers or evaluators 31 . . . 3n and 41 . . . 4n, via the switching transistors T31 . . . T3n and T41 . . . T4n, whose gate electrodes are connected to a common clock pulse voltage $\phi 2$.

Figure 2:
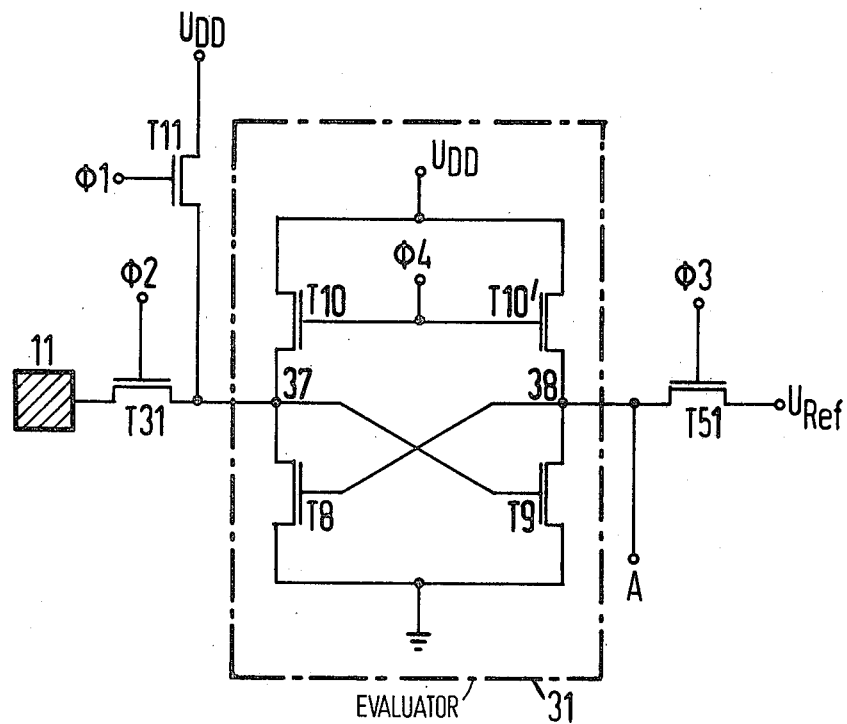
FIG. 2 shows a circuit portion of FIG. 1.

An expedient design of the evaluators 31 ... 3n and 41 ... 4n is to be described in greater detail on the basis of FIG. 2. Additional inputs of these evaluators are connected to terminals, via common switching transistors T51 and T52, whose gate electrodes are wired with a clock pulse voltage $\phi3$. These terminals are connected to a reference voltage $U_{Ref}$. The evaluators 31 ... 3n and 41 ... 4n can assume one of two possible switching states, in dependence upon the voltages which are supplied to them via the switching transistors T31 ... T3n and T41 ... T4n. Their output signals S11 ... S1n and S21 ... S2n, which, depending upon the assumed switching state, correspond to the logic voltage level "1" or "0", are supplied via transfer transistors T61 ... T6n and T71 ... T7n whose gate electrodes are subjected to a common clock pulse voltage $\phi5$, to the inputs of the individual stages 51, 52 ... 5n and 61, 62 ... 6n of two shift registers 5 and 6 which are individually associated with the image sensors. These shift registers 5 and 6 are preferably designed in the form of two-phase, dynamic shift registers. The shift register 5 exhibits two inputs which are wired with clock pulse voltages $\phi1L$ and $\phi2L$, whereas the shift register 6 possesses two inputs to which are supplied the clock pulse voltages $\phi1R$ and $\phi2R$. The output 5a of the stage 5n is connected with the input of the stage 51 via line 5b on the one hand and is guided to a first input of a logic circuit 8 arranged in an evaluating circuit 7. The output 6a of stage 6n is correspondingly connected to the input of the stage 61 via a line 9, and is connected to the second input of logic circuit 8, on the other hand.

At the output of logic circuit 8 is connected a counter 10 whose output is connected with the first input of a digital comparator 13 connected to a memory 15 via an electronic switch 14. The output of memory 15 is connected to a second input of the digital comparator 13.

A clock pulse generator 16 is provided with outputs for the clock pulse voltages $\phi1$ through $\phi3$ and $\phi5$. Via additional outputs 17 and 18, the clock pulse voltages $\phi1L$ and $\phi2L$, as well as $\phi1R$ and $\phi2R$, are emitted. A gate circuit 19 is arranged in series with the outputs 17 and a gate circuit 20 is arranged in series with the outputs 18. The control inputs of 19 and 20 are subjected, via lines 23 and 24, with control signals which are yet to be described in greater detail. The clock pulse generator exhibits an additional output 25, with which an additional gate circuit 26 is arranged in series. The latter is connected via line 27 to an additional control signal. The output 25 is connected to the input of a counter 28, whose output is in connection with a memory 30 via an electronic switch 29. The output 33 of memory 30 is connectd with a device 34 described below.

Next to the sensor elements 11 ... 1n, a strip-shaped comparison-sensor element 111 is arranged whose longitudinal axis is aligned parallel to the image sensor 1. The comparison sensor element is realized in the form of a photodiode, whereby the region illustrated in FIG. 1 with hatchings corresponds to the lateral dimensions of a re-doped zone of the semiconductor member. The zone of the semiconductor which is disposed between the sensor elements 11 ... 1n and the comparison-sensor element 111 is covered by a gate G subjected to a constant voltage $U_G$. This gate G is separated from the boundary surface of the semiconductor member by a thin insulating layer.

The comparison-sensor element 111 is connected, via a switching transistor T111, with a terminal which is wired with a supply voltage $U_{DD}$. The clock pulse voltage $\phi1$ is supplied to the gate of the transistor T111. On the other hand, the comparison-sensor element 111 is connected with the input of an evaluator 131 which corresponds in construction to the analyzers 31 ... 3n and 41 ... 4n. The reference voltage $U_{Ref}$ is supplied to the evaluator 131 via a switching transistor T151 subjected to a clock pulse voltage $\phi3'$. The output 131a of the evaluator 131 is connected to the control input of a gate circuit 116. The latter is arranged in series with one output 115 of the clock pulse generator 16 at which the clock pulse voltage $\phi2$ can be obtained. The circuit portions G, 111, T111, 131 and T151 represent the exposure measuring portion 300 as shown in FIG. 1 of the circuit whose output is formed by 131a.

FIG. 2 illustrates an embodiment of the evaluators 31 ... 3n, 41 ... 4n, and 131, on the basis of the evaluator 31. It consists of a flip-flop circuit with the switching transistors T8 and T9 and the transistors T10 and T10' operated as switchable load elements. The source-terminals of T8 and T9 are connected, via a common terminal 35, to the reference potential of the circuit. The drain terminals of T10 and T10' are connected, via a common terminal, to the supply voltage $U_{DD}$. The input of the evaluator 31 is referenced 37 and the output is referenced 38. Between the gate electrodes of T8 and T9 and the junctions 37 and 38 there is a crosscoupling. The gate electrodes of T10 and T10' of the evaluators 31 ... 3n and 41 ... 4n are wired with a clock pulse voltage $\phi4$ via a common terminal. The circuit parts T11, 11 and T31, as well as T51, connected to the junctions 37 and 38, have already been described on the basis of FIG. 1.

The principle of telemetry of an object, employed in the invention, proceeds from the assumption that from this object, via two optic installations represented by imager 200 in FIG. 1, two separate images are obtained whose distance-dependent relative positions can be analyzed. The light beams L1 in FIG. 1 proceed from the object whose distance is to be determined. They project via a first optical installation an image on the plane of the image sensor 1 such that the sensor is aligned to a line section of the image. In an analogous fashion, the light beams L2 which are obtained from the object via a second optical installation, project a second image on the plane of the image sensor 2 such that the latter is aligned to the same line section if the object is located at a prescribed distance, for example, the distance "infinity". If the distance of this object relative to the prescribed value varies, then the line sections projected on the image sensors 1 and 2 shift accordingly in a longitudinal direction of the image sensors. The magnitude of the reciprocal shift represents a measure of the actual distance of the object. A similar method of telemetry, in which the above described relative shifts of two images of the object are exploited, but in which instead of linear image sensors surface arrangements of photodiodes are provided, is, for example, known from the publication "Electronics" of 11/10/1977, pages 40 through 44, incorporated herein by reference.

Figure 3:
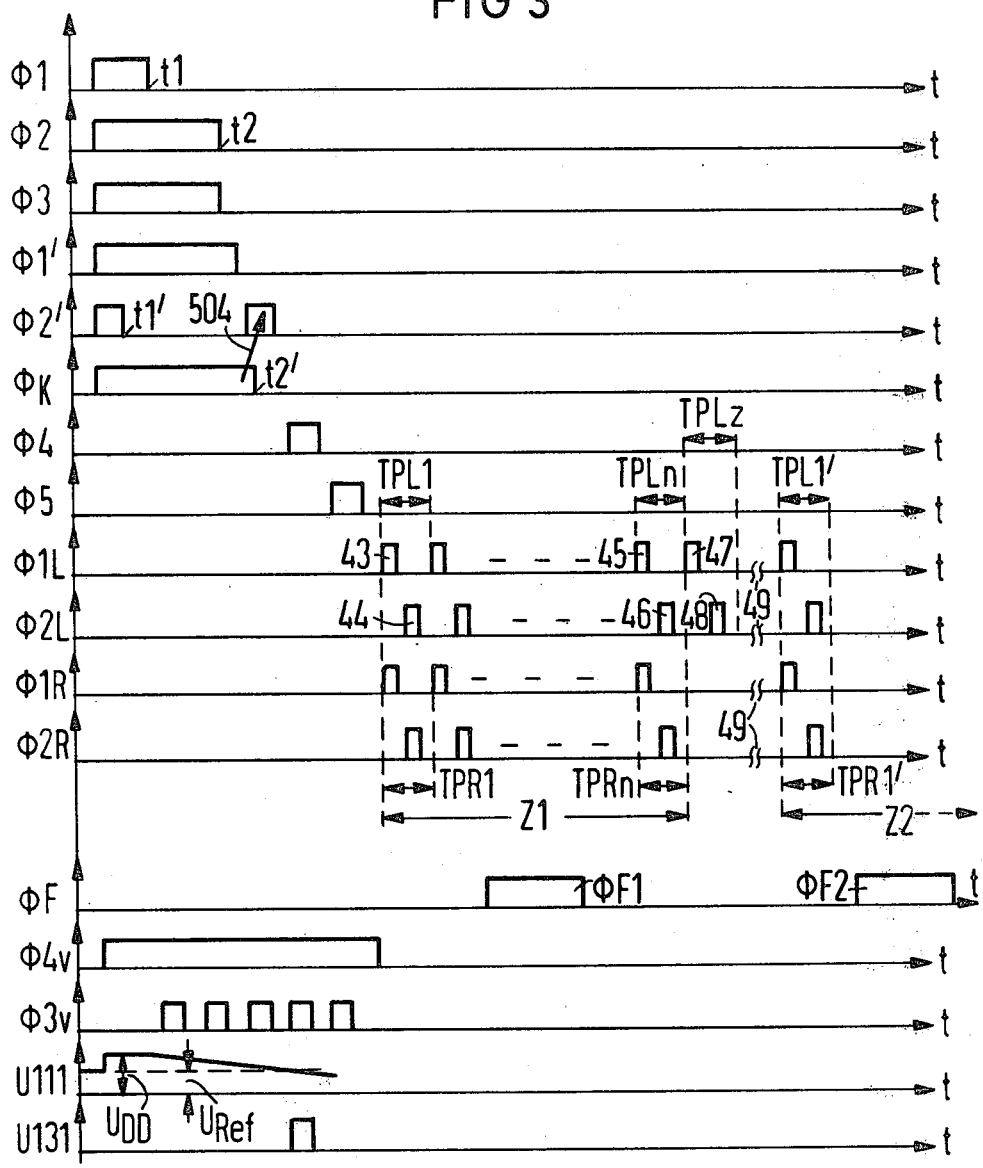
FIG. 3 shows voltage-time diagrams for explaining FIGS. 1 and 2.

The method of operation of the circuit according to FIGS. 1 and 2 is apparent in conjunction with pulse-time diagrams shown in FIG. 3. If a trigger pulse is supplied to one input 39 of the clock pulse generator 16, then the latter first emits clock pulses $\phi1$ and $\phi2$. The sensor elements such as 11, and the inputs such as 37 of the evaluators 31 ... 3n and 41 ... 4n, are thus reset via the conductive transistors, for example T11 and T31, to the supply voltage $U_{DD}$. A simultaneous clock pulse $\phi3$ switches T51 into the conductive state so that the output junction 38 is connected to the reference voltage $U_{Ref}$. Upon disconnection of the clock pulse $\phi 1$, charge carriers generated by the incident light beams L1 or L2, respectively, begin to collect in the sensor elements, for example 11. Accordingly, a voltage drop results in the sensor elements. The greater the optically generated charges which are collected in the sensor elements 11 ... 1n and 21 ... 2n, the greater the reduction in potential at the associated input terminals, for example 37 of the evaluators. The time span between the end of the clock pulse $\phi 1$ to the time t1, and between the end of the clock pulse $\phi 2$ to the time t2, is referenced as integration time $T_i$. Only within this time span are optically generated charges collected in the sensor elements.

Subsequent to termination of the clock pulse $\phi 2$ and subsequent to termination of the clock pulse $\phi 3$, a clock pulse $\phi 4$ which can be tapped at an additional output of the clock pulse generator, is connected to the gate electrodes of T10 and T10′, so that the flip-flop circuits of the evaluators 31 ... 3n and 41 ... 4n are activated. In the case that such a voltage drop occurred at 37 so that there was a drop therebelow of the reference voltage $U_{Ref}$, a voltage results at the output junction, for example 38, which approximately corresponds to the supply voltage $U_{DD}$ (logic "1"). If, by contrast the voltage at 37 does not fall below $U_{Ref}$, then the junction 38 attains a potential which approximately corresponds to the reference potential at terminal 35 (logic "0"). Thus, every evaluator emits a digitized sensor signal, for example S11, whose value is dependent upon the attainment or non-attainment of a reference charge in the individual sensor element present precisely when the potential at junction 37 at time t2 equals the potential of the junction 38 reset to voltage $U_{Ref}$.

Circuit portions G, 111, T111, 131 and T151 serve the purpose of determining the optimum integration time. In the comparison sensor element 111, after time t1 (i.e., after the trailing edge of $\phi 1'$) an optically generated charge collects which in each instance corresponds to the mean value of the exposure of all sensor elements 11 ... 1n which are disposed next to the comparison sensor element 111. In the case of a very strong exposure of a small portion of the sensor element line 111 ... 1n and a very slight exposure of the remaining substantially greater portion of the sensor element line, this mean value is only slightly greater than the dark value which would result in the case of a dark line section. Therefore, the reference charge at which the evaluator 131 is switched over into the switching state by emitting a logic output signal "1", is attained only after a greater time span. In the case of an extremely strong exposure of some sensor elements which results in an overflow of portions of the collected, optically generated charges from the affected sensor elements, the overflowing charge portions now overcome the potential threshold existing beneath the gate G and reach the comparison-sensor element 111, whose charge content is thereby strongly increased so that the reference charge is substantially more rapidly attained than before.

Through the charge optically generated in 111 and the overflow of partial charges at sensor elements 11 ... 1n into the comparison sensor element 111, the voltage U111 on the same drops, proceeding from the reset value $U_{DD}$ (FIG. 3). If $U_{Ref}$ is respectively supplied to the evaluator 131, which is actively connected during the occurrence of the clock pulse $\phi 4$ v via transistor 151 during the occurrence of clock pulses $\phi 3$ v, then, at the clock pulse $\phi 3$ v when U111 has already fallen below the voltage $U_{Ref}$, the changeover switching of the evaluator 131 to the output signal "1" will take place. This blocks the gate circuit 116 and terminates the pulse $\phi 2$, as a consequence of which the end of the integration time for the sensor elements 11 ... 1n and 21 ... 2n is provided.

Upon occurrence of a clock pulse $\phi 5$, the digitized sensor signals, for example S11, emitted by the evaluators 31 ... 3n and 41 ... 4n, are then supplied to the inputs of the associated states, for example, 51 of the shift registers 5 and 6, and are stored in the latter.

The clock pulse generator 16 subsequently supplies clock pulse trains $\phi 1L$, $\phi 2L$, $\phi 1R$ and $\phi 2R$, which shift the data contained in the stages of the shift registers 5 and 6 by one stage, respectively. Prior to the occurrence of the clock pulses 43 and 44, which belong to one clock pulse period TPL1, the sensor signal S1n appears at the output 5a. The clock pulses 43 and 44 shift the information S1n into the stage 51 and the information S1(n−1) to the output 5a, and so on. Through the clock pulses 45 and 46 of the clock pulse period TPLn, after a full information cycle the sensor signal S1 again reaches the output 5a. A clock pulse period TPLz with the clock pulses 47 and 48 permits the sensor signal S1(n−1) to appear at the output 5a. Subsequent to a following blanking interval referenced 49, the clock pulses 53 and 54 of the clock pulse period TPL1′ shift the sensor signals again one step farther, so that S1(n−1) reaches the stage 51 and S1(n−2) is connected through to the output 5a.

In a first readout cycle Z1, which comprises the clock pulse periods TPL1 through TPLn, the sensor signals S1n through S1 and again S1n are thus serially output at the output 5a. In a second readout cycle Z2, which comprises the clock pulse periods TPL1′ and n−1 additional clock pulse periods, a second serial output of all sensor signals of the image sensor 1 takes place, whereby the signals S1(n−1) through S1 and again S1n and S1(n−1) occur at 5a. Within this first readout cycle Z1, the shift register 6 is likewise subjected to n clock pulse periods TPR1 through TPRn, whereas the clock pulses 47 and 48 are lacking in corresponding pulses. This has as a consequence that, at the commencement of Z2, the sensor signal S2n is connected to the output 6a and the signal S1(n−1) is connected to the output 5a.

Thus, in the first readout cycle Z1, the signal pairs S1n and S2n, S1(n−1) and S2(n−1), etc. are serially read out at 5a and 6a. In the second readout cycle, the signal pairs S1(n−1) and S2n, S1(n−2) and S2(n−1), etc. The serially readout data of the shift registers 5 and 6 are thus, in two successive readout cycles, shifted in relation to one another by one signal width, respectively. After n readout cycles, they then again have the same chronological allocation as in the cycle Z1. In FIG. 1, this shifting can be achieved by virtue of the fact that the gate circuit 20, via line 24, during the occurrence of the clock pulses 47 and 48 (i.e. between clock pulse periods TPRn and TPR1′) is blocked. In this time period, the gate circuit 26 via control line 27 can be opened, so that one of the pulses 47 or 48 or a pulse derived from the latter appears at the output 25 as a shift pulse P1. This shift pulse P1 here characterizes the commencement of the new readout cycle and a mutual shifting of the sensor signals, which are serially read out at the outputs 5a and 6a, by one signal width, respectively.

The sensor signal pairs, read out within a readout cycle, for example, Z1, are analyzed in the logic circuit 8 according to the exclusive-OR function. An output pulse then always occurs at the output 55 of 8 when the digital signals, supplied at the input side via 5a and 6a, correspond. If they do not correspond, then no output signal is emitted by 8. The partial circuit 8, however, can also be so designed that it only indicates the correspondence of two "1"-signals or two "0"-signals at their inputs by means of an output pulse. The counter 10, which is reset to zero prior to commencement of every readout cycle (i.e., in the blanking intervals 49), then counts the number of correspondencies within such a cycle.

However, the counter 10 is here operatively connected only during a portion of every readout cycle which is determined by a pulse $\phi F$ emitted by 16. If one assumes that the counter 10 in the readout cycle Z1 counts the correspondencies within the clock pulses periods $TPR_i$ to $TPR_k$, whereby the difference $k-i$ amounts approximately to n/2 or 3n/4, then it counts in the readout cycle Z2 the correspondencies within the clock pulse periods $TPR'_{i+1}$ to $TPR'_{k+1}$. If one considers the pulses $\phi F1$ and $\phi F2$ as "readout windows", then the sensor signals of the shift register 6 in the window $\phi F2$ have been shifted one signal width to the left in relation to the window $\phi F1$ (FIG. 3). In the next readout cycle Z3, in which the corresponding pulse $\phi F3$ comprises the same clock pulse periods as in Z2, the signals of register 5 in the "window" $\phi F3$ have then shifted one signal width to the right. If the "window" is generally shifted to the right by one clock pulse period length, respectively in the first readout cycle Z1 and in the additional readout cycles Z3, Z5, Z7, etc., then this corresponds to an alternate shifting of the sensor signals, tapped at 6a or 5a, respectively, in the respective window $\phi F$ by one signal width to the left or to the right. Those pulses $\phi F$ which would simultaneously encompass the analyzing signals derived from the line beginning and from the line ending of one of the sensor element lines, are suppressed by the clock pulse generator 16. What is achieved hereby is that the "windows" $\phi F$ preclude the analysis of those sensor signals which have been derived from the beginning and end sections (disposed adjacent one another in exchanged allocation) of the projected line sections, so that they convey no information regarding the actual brightness progression along the length of the line section.

If the count result which is supplied to the input 56 of the digital comparator 13 is greater than the digital signal connected to its input 57, the control inputs of the switches 14 and 29 are subjected to a comparator signal. This brings both switches into switching states in which they transmit the signals connected to their inputs to the respective outputs. After the count result of the correspondencies of the first information cycle Z1 is supplied as a first digital signal to the memory 15 and via the latter to the input 57 of the comparator, subsequently the count result of an additional information cycle Zi is still transferred into the memory 15. This count is greater than the greatest which has been previously stored. The shift pulses P1, P2, etc., occurring at the end of the information cycles Z1, Z2 and so on, are counted in the counter 28. Since the counter 29 is operated synchronously with the counter 14, it always transmits upon occurrence of a greater count result in the counter 10, the respectively new counterreading of 28 to the memory 30. Thus, in the memory 30 after n information cycles, the number of shift pulses Pi is stored which characterizes such an information shift between the sensor signals of the shift registers 5 and 6 at which the greatest number of correspondencies occurs. In other words: the number of shift pulses P1, P2, etc., stored in the memory 30 emits the relative shift of the sensor signals circulating in the shift registers 5 and 6, at which a maximum correlation of the sensor signals which have been compared with one another exists.

The blanking intervals 49, indicated in FIG. 3, which, for example are necessary for the respective resetting of the counter 10 to zero, are generated by a corresponding blocking of the gate circuits 19 and 20 via their control lines 23 and 24.

The digital signal occurring at output 33 of the memory 30 is supplied to a device 34 which can be conceived as a display device which, after a corresponding coding of the digital signal, delivers a digital or analog display of the distance of the object. On the other hand, the device 34 can also consist of an adjustment device known per se such as a photographic or electronic camera which adjusts the distance of an object movable in relation to an image plane, so that the object is sharply reproduced on this image plane. A device of this type is described, for example, in German patent application P No. 28 13 915.3, corresponding to U.S. Pat. No. 4,247,761, and in the Journal "Electronics" of Nov. 10, 1977, on pages 40 through 44, both incorporated herein by reference.

Figure 4:
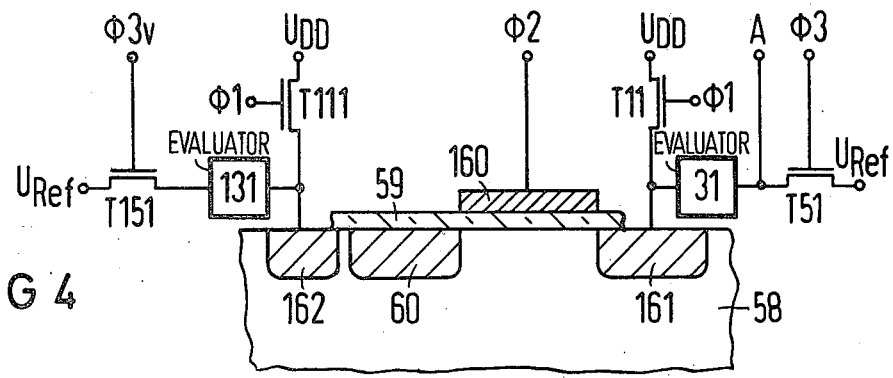
FIG. 4 shows a first embodiment of the image sensors according to FIG. 1.

FIG. 4 shows a circuit-technical design of the sensor elements 11 . . . 1n and 21 . . . 2n, as well as of the bordering circuit parts on the basis of the sensor element 11. On a doped semiconductor member 58, for example of p-doped silicon, a thin electrically insulating layer 59 for example of $SiO_2$, is provided. The image sensor is here designed as a photodiode which consists of the n-doped semiconductor zone 60. This zone simultaneously also forms the source zone of the transistor T31 (FIG. 1). The gate of T31 is arranged on the insulating layer 59 and is referenced 160. The drain zone of T31 bears the reference numeral 161. Zone 161 is connected, on the one hand via transistor T11 to a terminal which is wired with the supply voltage $U_{DD}$, and, on the other hand forms the input of the evaluator 31 or the drain zone of the transistor T8 provided therein (FIG. 2), and the source zone of the transistor T10. The second input of 31 corresponding to FIG. 2 is connected via transistor T51 subjected to $\phi 3$ by a terminal connected to the reference voltage $U_{Ref}$. The comparison-sensor element 111 is designed as a photodiode consisting of the n-doped zone 162. The zone 162 is, on the one hand, connected via transistor T111 subjected to $\phi 1$ by a terminal connected to $U_{DD}$, and, on the other hand, is connected to the first input of the analyzer 131, whose second input is connected via a transistor T151 subjected to $\phi 3v$, to the reference voltage $U_{Ref}$. Between zones 60 and 162 there is a gate G which is separated by the insulating layer 59 from the boundary surface 58 of the semiconductor members. It is connected to a constant voltage $U_G$ which is selected such that a potential barrier results beneath G which is smaller than that between zone 60 and the corresponding zones of the sensor elements adjacent 11.

Figure 5:
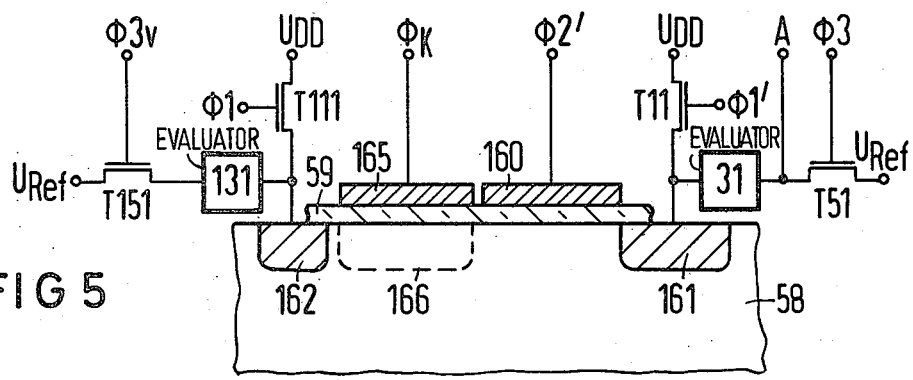
FIG. 5 shows an alternate embodiment to FIG. 4.

An alternative circuit to FIG. 4 is shown in FIG. 5. According to this circuit, the sensor element 11 consists of an MIS-capacitor (metal-insulating layer-semiconductor-capacitor) which possesses a gate 165 arranged on the insulating layer 59. Gate 165 is fabricated e.g.

from highly doped polycrystalline silicon, and is connected to a clock pulse voltage $\phi_K$ under the influence of which a space charge zone 166 in the semiconductor member 58 develops. The additional circuit parts of FIG. 5 correspond to the circuit parts of FIG. 4, provided with the same reference signs, whereby it is pointed out that the transistor T11 is provided with a clock pulse voltage $\phi 1'$, and the transistor T31 is provided with a clock pulse voltage $\phi 2'$. The simultaneously beginning clock pulses $\phi 1'$, $\phi 2'$ and $\phi_K$ effect, up to time t1', a resetting of the MIS-capacitor in the zone of the boundary surface 58a of the semiconductor member 58 to approximately the value of the supply voltage $U_{DD}$. At time t1', in the MIS-capacitor further subjected to $\phi_K$, the integration time begins in which optically generated charge carriers are collected. With the end of $\phi_K$ at the time t2', the end of the integration time is also reached. Shortly before time t2', a new clock pulse $\phi 2'$ is connected, so that the charge transfer indicated by arrow 504 (FIG. 3), from 166 to 161 can take place. This brings about a corresponding potential change at the input of evaluator 31. Clock pulse $\phi 1'$ must, as indicated in FIG. 3, be disconnected prior to this charge transfer. The gate G is here disposed between zone 162 and gate 165 of the MIS-capacitor.

Figure 6:
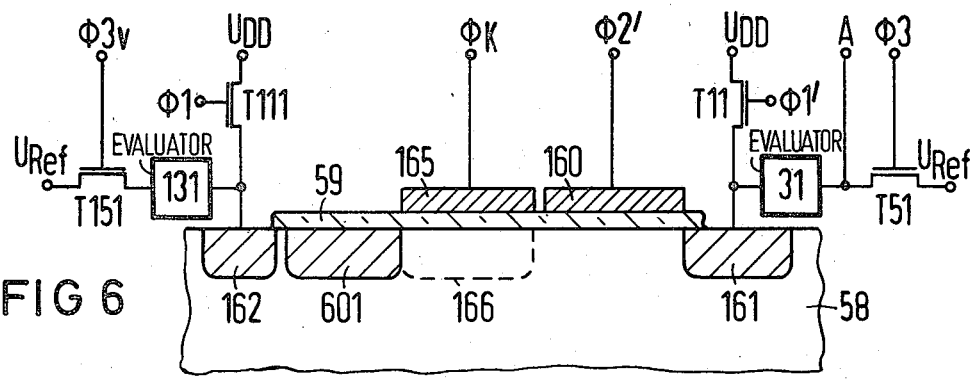
FIG. 6 shows a second alternative embodiment to FIG. 4.

FIG. 6 differs from FIG. 5 only by virtue of the fact that a photodiode 601 is arranged next to the MIS-capacitor 165, 166, namely on the side of the same which is not facing T31. The gate electrode of T31 is connected with the pulse voltage $\phi 2'$, whereas the clock pulse voltage $\phi 1'$ is supplied to the gate electrode of T11. The gate G is here disposed between the zones 162 and 601. The capacitance of the sensor element 11 according to FIG. 5 is greater than the capacitance of the sensor element according to FIG. 4, whereas the capacitance of the sensor element 11 according to FIG. 6 is greater than that of the embodiment according to FIG. 5.

Figure 7:
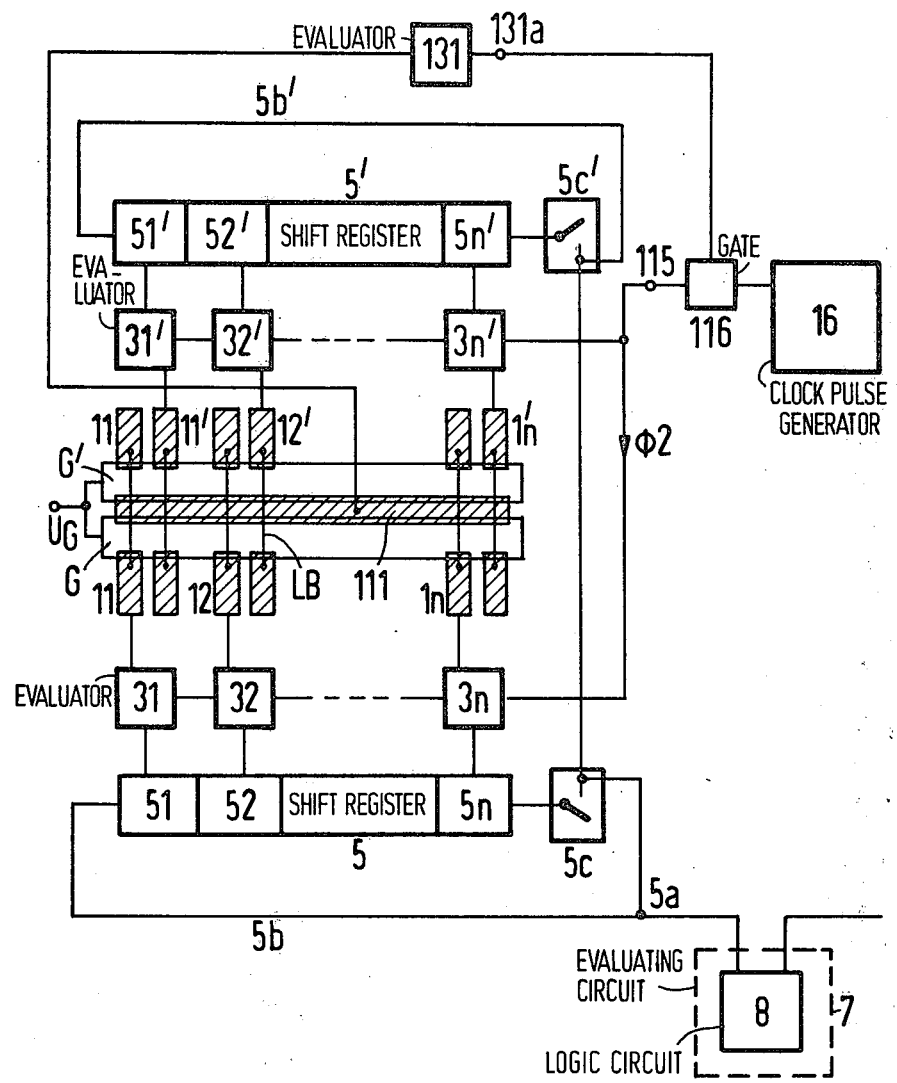
FIG. 7 shows a second sample embodiment of the invention.

In FIG. 7, a second sample embodiment of the invention is shown in which two circuits according to FIG. 1 are provided with a common evaluator circuit 7 and common devices 34, connected with the latter. The component parts of the partial circuit, arranged in FIG. 1 at the left side of the evaluating circuit 7, are provided in FIG. 7 with the same reference signs. The individual sensor elements 11, 12 . . . 1n, in longitudinal direction of the image sensor 1, are here so narrowly designed that they correspond to approximately half the dimension of the evaluators 31, 32 . . . 3n. For the purpose of simple illustration, also the switching transistors T11, etc., T31, etc., T61, etc., T111, etc., as well as T151, where included in these evaluators. The corresponding component parts of the second circuit according to FIG. 1 are provided in FIG. 7 with reference signs, respectively, which are supplemented by a dash. As is apparent, the sensor elements 12 . . . 1n of the one image sensor are arranged in the intervals between the sensor elements 11', 12' . . . 1n' of the other image sensor. The sensor elements are divided in the center, whereby their parts are interconnected with a conductive bridging, for example LB. In the intervals between the respective sensor element parts, the comparison sensor element 111 is located whose non-doped zone 162 is hatched in FIG. 7, and the gates G and G' of which are connected to voltage $U_G$. In this sample embodiment, it is possible to accommodate on one sensor length, corresponding to FIG. 1, double the number of sensor elements, so that the resolution of the line sections projected on the sensor elements is substantially greater than in FIG. 1. In order to prevent a mutual interference of the information circulation in the shift registers 5 and 5', alternately actuatable electronic switches 5c and 5c' are provided which alternately connect one of the outputs 5a and 5a' with the one input of the logic circuit 8 and with the input of the respective first stage 51, or 51', of the shift register. They are actuated by means of clock pulse voltages $\phi 6$ and $\phi 6'$. The clock pulse periods of $\phi 6$ are here separated from one another by intermediate periods of equal length. The clock pulse periods of $\phi 6'$ coincide chronologically with these intermediate periods. The circuit illustrated in FIG. 7 is to be supplemented on the right side of the evaluating circuit 7 by a corresponding arrangement of two additional image sensors 2 and 2' and the analyzers and shift registers associated with them, whereby their sensor elements are likewise so narrowly designed that they correspond to half the evaluator width, measured in the longitudinal direction of the image sensors 2 or 2'.

Figure 8:
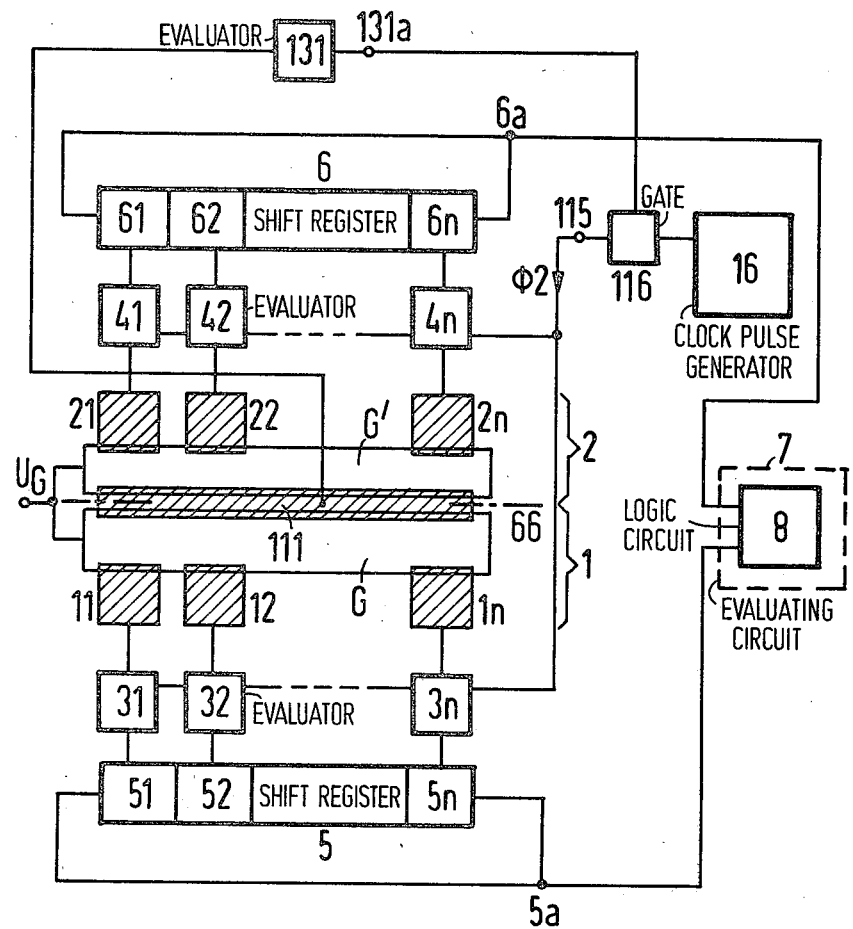
FIG. 8 shows a third sample embodiment of the invention.

FIG. 8 illustrates a circuit corresponding to FIG. 1, in which the image sensors 1 and 2 are arranged next to one another, so that their sensor elements 11, 12 . . . 1n and 21, 22 . . . 2n lie in two adjacently disposed rows. The evaluators 31, 32 . . . 3n and 41, 42 . . . 4n also contain the switching transistors T11, etc. to T71, etc., the evaluators 131 . . . 13n, the transistors T111, etc., and T151. This sample embodiment can be utilized when the images of the object are to be half projected on the plane of the image sensors of 1 and 2. The upper half of the one image falls on the part of the image plane which lies above the intersection line 66, whereas the lower half of the other image is projected on the part of the image plane disposed below the intersection line 66. The line sections analyzed by means of the image sensors 1 and 2, here lie on the respective boundaries of the image halves which are adjacent to the line 66. Such a type of image projection is also described in German patent application P No. 28 38 647.2, incorporated herein by reference. In the circuit according to FIG. 8, preferably two gates G and G', wired with $U_G$, are provided which are arranged between the sensor element lines 11 . . . 1n, or 21 . . . 2n, respectively, and the comparison sensor element 111.

The described and illustrated circuits can, with particular advantage, be monolithically integrated entirely or partially on a doped semiconductor member. Preferably the semiconductor member, for example 58, is designed to be p-conductive, and the remaining circuit construction is designed in MOS n-channel technique. The semiconductor member is connected to a reference potential, whereby the indicated voltages and potentials exhibit a positive polarity sign, respectively, in relation to the latter. In the case of an n-conductive semiconductor member and an MOS p-channel technique, these polarity signs become negative. The described and illustrated sample embodiments, in the region of the image sensors 1 and 2, exhibit stops or irises in which apertures are provided through which an exposure of the sensor elements and of the comparison sensor element takes place. In operation, for example, the following voltage values can be selected: $U_{DD}=5$ to 12 volts, $U_G=1$ to 2 volts, $U_{Ref}=U_{DD}/2$.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A circuit having an exposure measuring portion and designed for sensor-controlled range measurement, comprising: two linear image sensors having sensor elements integrated on a doped semiconductor member; means for projecting line segments corresponding to two images separately obtained from an object onto the corresponding image sensors; and evaluator means connected to each of the sensor elements for switching between two different switching states depending upon whether a reference charge in the sensor elements is exceeded so as to digitalize sensor signals; an evaluating circuit means for evaluating the digitalized sensor signals in dependence upon varying relative position shifts with respect to a maximum correlation; device means connected to the evaluating circuit means for indicating a range of said object; an exposure measuring circuit having means for determining integration time of the sensor elements including a strip-shaped comparing sensor element co-integrated on the semiconductor member and longitudinally extending and positioned for exposure to an optically generated charge quantity which corresponds to a plurality of sensor elements in at least one of the image sensors; said comparison sensor element being designed as a strip-shaped photodiode arranged next to the sensor element row in at least one of the image sensors; and above a zone of the semiconductor member between the sensor element row and the comparison sensor element, a gate separated by a thin insulating layer from the semiconductor member is provided, said gate being subject to a constant voltage.

2. A circuit according to claim 1 wherein each of the linear image sensors has two parallel rows of sensor elements with the comparing sensor element arranged between the two rows; each image sensor element being dimensioned in the longitudinal direction of the image sensor so that they correspond approximately to half of a corresponding dimension of the evaluator means associated therewith, each of the sensor elements in the first row connecting by a conductive bridge to a corresponding and adjacent element in the second row; a gate electrode being positioned on an insulating layer between one of the rows of sensor elements and the comparing sensor element and another gate electrode on the insulating layer between the other row and the comparing sensor element, the two gate electrodes being subjected to a constant voltage.

3. A circuit according to claim 2 wherein alternate pairs of interconnected sensor elements connect to corresponding evaluator means on alternate sides of the image sensor.

4. A circuit according to claim 1 wherein two linear image sensors are arranged longitudinally in the same direction and the evaluator means associated with each linear sensor connect to a shift register, the evaluator means and shift register being positioned adjacent the corresponding linear image sensor.

5. A circuit according to claim 1 wherein the evaluator means connected to the sensor elements and the comparing sensor elements each have an input connected via a switching transistor to a constant voltage source.

6. A circuit according to claim 5 wherein the evaluator means connected to the sensor elements and the comparing sensor element have a further input which is connected via a further switching transistor with a reference source.

7. A circuit according to claim 1 wherein the sensor elements of the linear image sensor are designed as MIS (Metal-Insulator-Semiconductor) capacitors.

8. A circuit according to claim 1 wherein the sensor elements of the linear image sensors are designed as photodiodes.

9. A circuit according to claim 1 wherein the sensor elements of the linear image sensors are designed as MIS (Metal-Insulator-Semiconductor) capacitors to which photodiodes are arranged adjacent thereto.

10. A circuit according to claim 1 wherein the circuit is at least partially monolithically integrated, on said doped semiconductor member.

11. A circuit according to claim 1 wherein said means for projecting and device means are designed for range finding in a camera.

12. A circuit according to claim 11 wherein said device means controls a focus adjustment to project an image on a predetermined focal plane.

* * * * *